(12) United States Patent
Tsen et al.

(10) Patent No.: US 9,997,420 B2
(45) Date of Patent: Jun. 12, 2018

(54) METHOD AND/OR SYSTEM FOR CHEMICAL MECHANICAL PLANARIZATION (CMP)

(71) Applicant: Taiwan Semiconductor Manufacturing Company Limited, Hsin-Chu (TW)

(72) Inventors: Yen-Di Tsen, Chung-Ho (TW); Cheng Yen-Wei, Hsinchu (TW); Jong-I Mou, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days. days.

(21) Appl. No.: 14/141,520

(22) Filed: Dec. 27, 2013

(65) Prior Publication Data

US 2015/0187662 A1   Jul. 2, 2015

(51) Int. Cl.
*B24B 37/015* (2012.01)
*B24B 37/04* (2012.01)
(Continued)

(52) U.S. Cl.
CPC ............ *H01L 22/12* (2013.01); *B24B 37/005* (2013.01); *H01L 21/30625* (2013.01); *H01L 22/26* (2013.01)

(58) Field of Classification Search
CPC ..... B24B 37/013; B24B 37/042; B24B 49/12; G01B 11/0625; G01B 11/0683;
(Continued)

(56) References Cited

U.S. PATENT DOCUMENTS 5,240,552 A * 8/1993 Yu ........................... B24B 37/04
                                                     257/E21.244
5,888,120 A * 3/1999 Doran ................... B24B 37/005
                                                     451/285
(Continued)

FOREIGN PATENT DOCUMENTS

TW       541233      7/2003
TW       I361454     4/2012

OTHER PUBLICATIONS

Corresponding Taiwan application No. 103145707, Taiwan Office action dated Oct. 21, 2016, 7 pages.

*Primary Examiner* — Bradley K Smith
*Assistant Examiner* — David Goodwin
(74) *Attorney, Agent, or Firm* — Cooper Legal Group, LLC

(57) ABSTRACT

One or more methods or systems for performing chemical mechanical planarization (CMP) are provided. The system includes at least one of an emitter, a detector, a spectroscopic signal generator, a comparator, a spectral library, a controller or a CMP device. A spectroscopic signal is generated and is used to determine the thickness of a first material formed on or from a wafer by comparing the spectroscopic signal to a spectral library. Responsive to the thickness not being equal to the desired thickness, the controller instructs the CMP device to perform a rotation to reduce the thickness of the first material. The system and method herein increase the sensitivity of the CMP, such that the thickness of the first material is reduced with greater accuracy and precision, as compared to where the thickness is not measured between consecutive rotations of a wafer.

20 Claims, 5 Drawing Sheets

(51) Int. Cl.
*H01L 21/66* (2006.01)
*B24B 37/005* (2012.01)
*H01L 21/306* (2006.01)

(58) Field of Classification Search
CPC ........... H01L 21/30625; H01L 21/3212; H01L 21/67092; H01L 21/67253; H01L 22/12; H01L 22/20
USPC .......................................... 438/14, 16, 17, 64
See application file for complete search history.

(56) References Cited

U.S. PATENT DOCUMENTS

| | | | | |
|---|---|---|---|---|
| 6,107,186 | A * | 8/2000 | Erb | H01L 21/3212 205/103 |
| 6,142,855 | A * | 11/2000 | Nyui | B24B 49/12 356/630 |
| 6,338,667 | B2 * | 1/2002 | Sandhu | 451/10 |
| 7,751,609 | B1 * | 7/2010 | Berman | B24B 37/013 348/125 |
| 2002/0192966 | A1 * | 12/2002 | Shanmugasundram | B24B 37/013 438/692 |
| 2003/0022400 | A1 | 1/2003 | Nomoto et al. | |
| 2007/0135020 | A1 * | 6/2007 | Nabeya | B24B 37/015 451/7 |
| 2009/0036026 | A1 | 2/2009 | David et al. | |
| 2010/0323355 | A1 | 12/2010 | David et al. | |
| 2012/0276816 | A1 * | 11/2012 | Ono | B24B 37/015 451/7 |
| 2013/0273812 | A1 | 10/2013 | Qian et al. | |
| 2014/0017824 | A1 * | 1/2014 | Iizumi | H01L 21/30625 438/16 |
| 2014/0206259 | A1 * | 7/2014 | Benvegnu | B24B 37/013 451/6 |

* cited by examiner

METHOD AND/OR SYSTEM FOR CHEMICAL MECHANICAL PLANARIZATION (CMP)

BACKGROUND

During fabrication of semiconductor devices on a wafer, chemical mechanical planarization (CMP) is performed to smooth surfaces of the wafer using chemicals and/or mechanical forces. For example, the wafer can be polished to prepare the wafer for a new layer of material. In one example of polishing, the wafer can be secured to a polishing head configured to hold and rotate the wafer (e.g., vacuum pressure can be used to secure the wafer to the polishing head). The polishing head can apply force to the wafer toward a polishing pad during polishing. The polishing head can rotate the wafer against the polishing pad, which can also be rotating, to apply mechanical force to the wafer to remove material and/or even out irregular topography of the wafer, for example. In one example, chemicals, such as slurry (e.g., colloid), can be applied to the polishing pad during polishing to serve as solvents which aid in reducing non-uniformities on the surface of the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
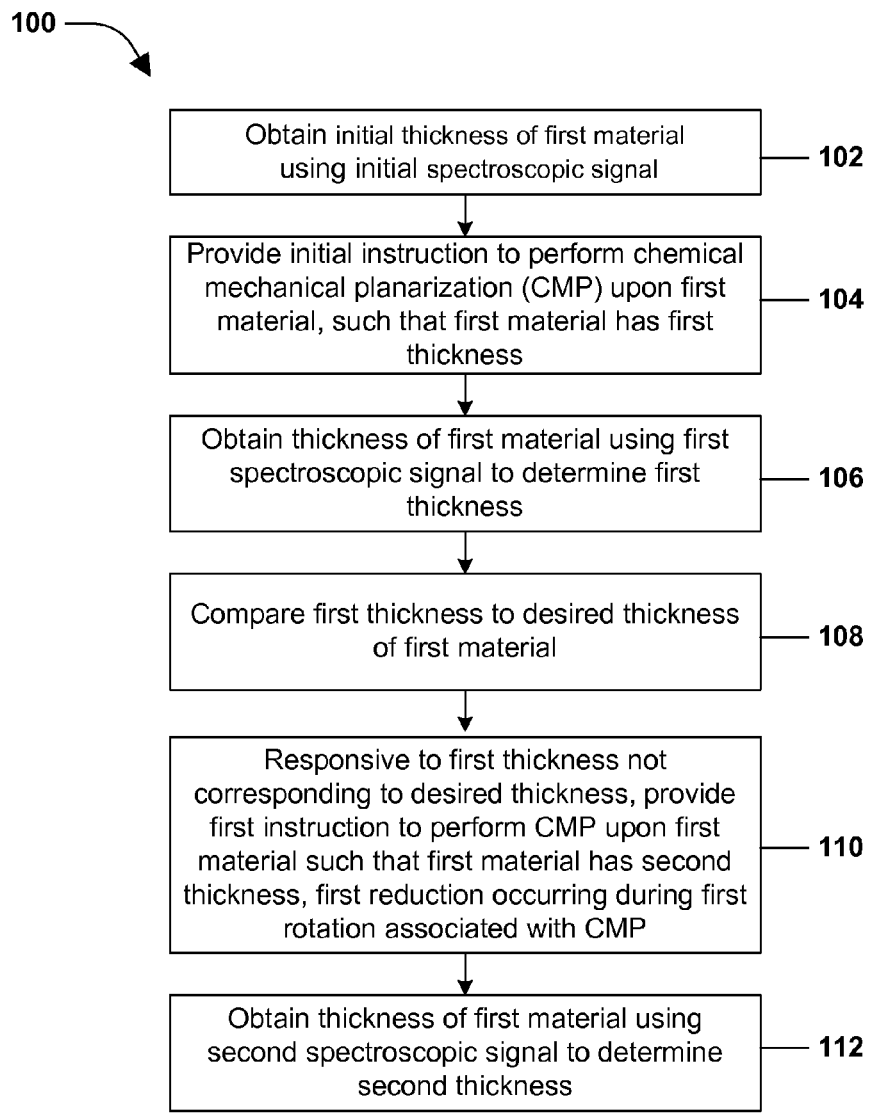
FIG. 1 is a flow diagram illustrating a method of performing chemical mechanical planarization (CMP), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

At least one of one or more methods for performing chemical mechanical planarization (CMP) or one or more systems for CMP are provided herein.

Figure 2:
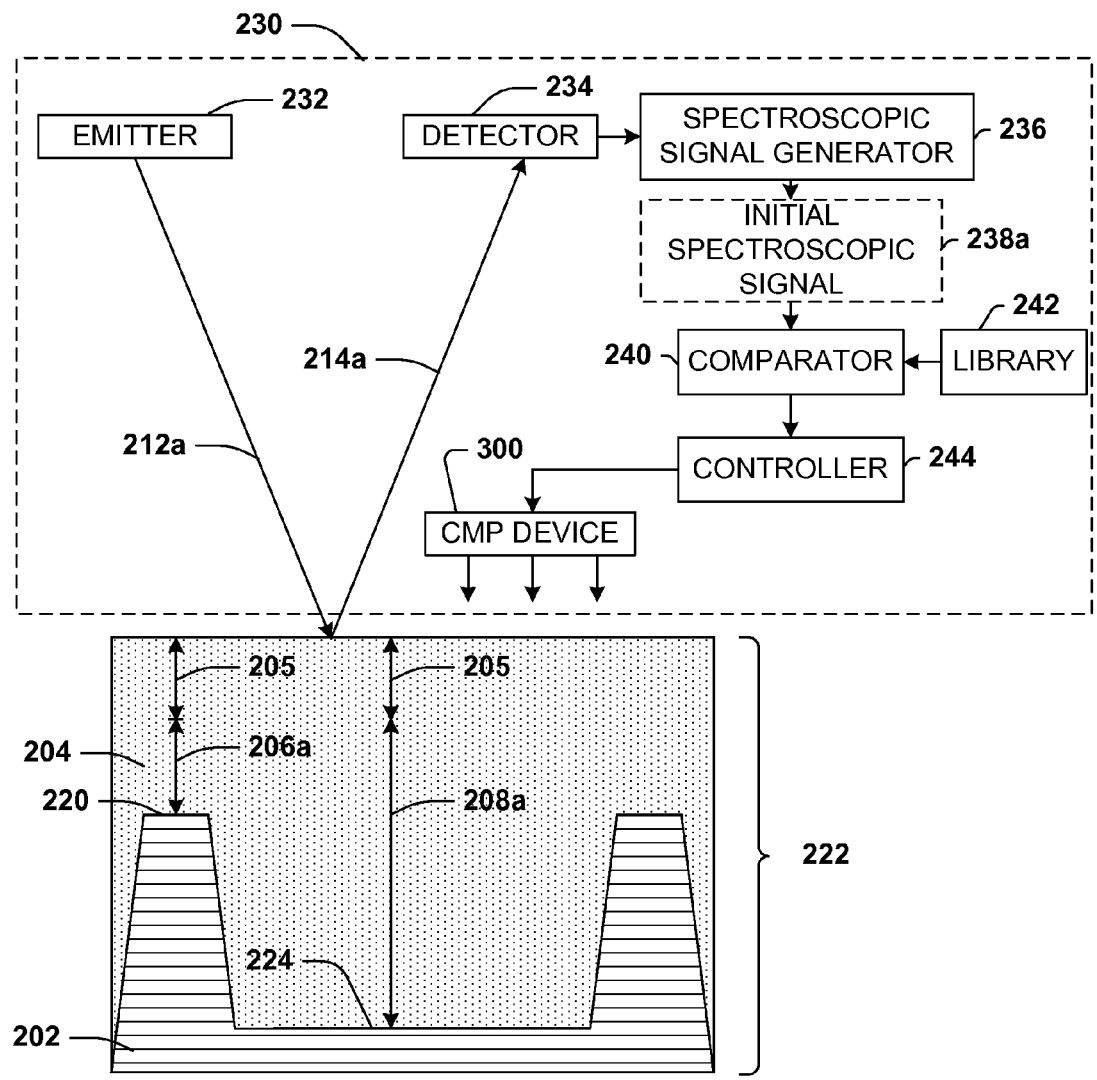
FIG. 2 is an illustration of performing CMP, in accordance with some embodiments.
Figure 3:
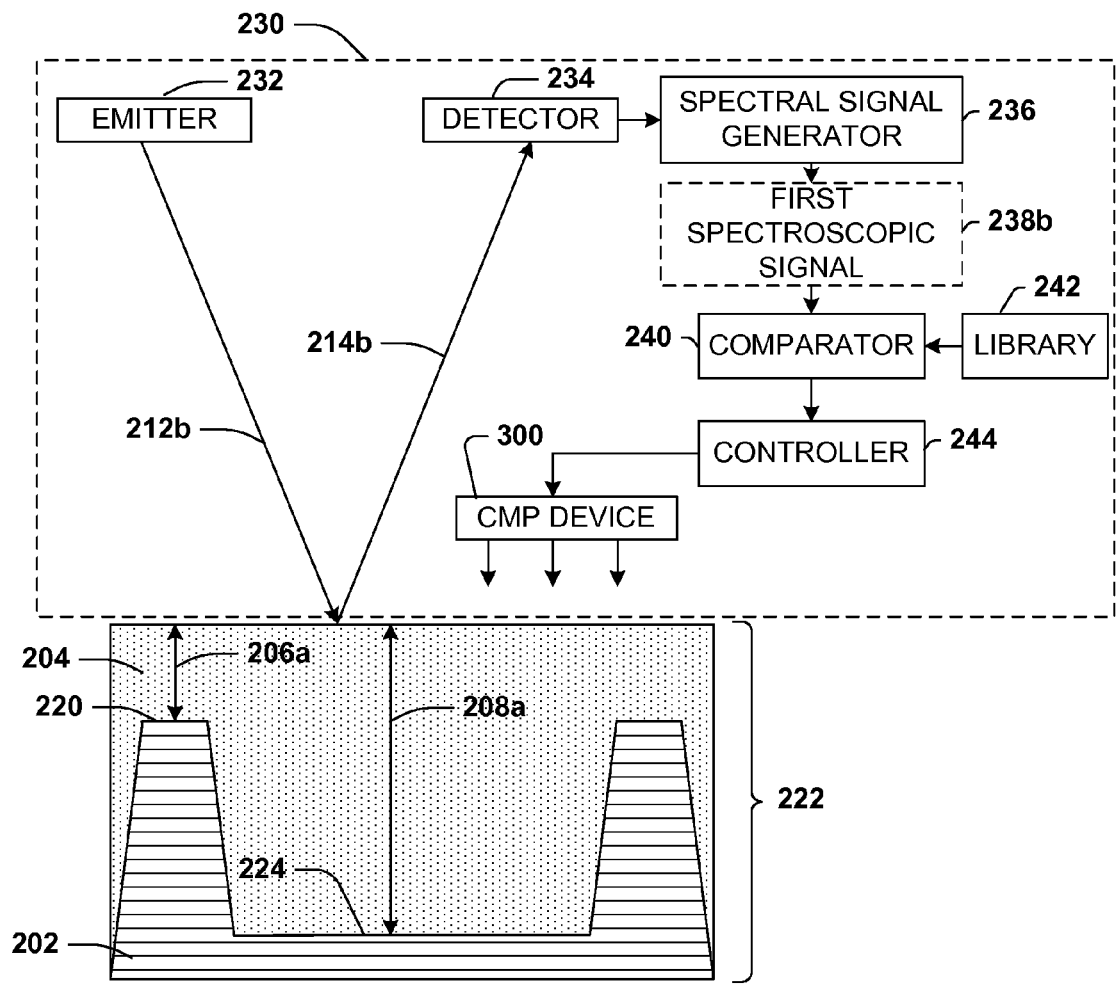
FIG. 3 is an illustration of performing CMP, in accordance with some embodiments.
Figure 4:
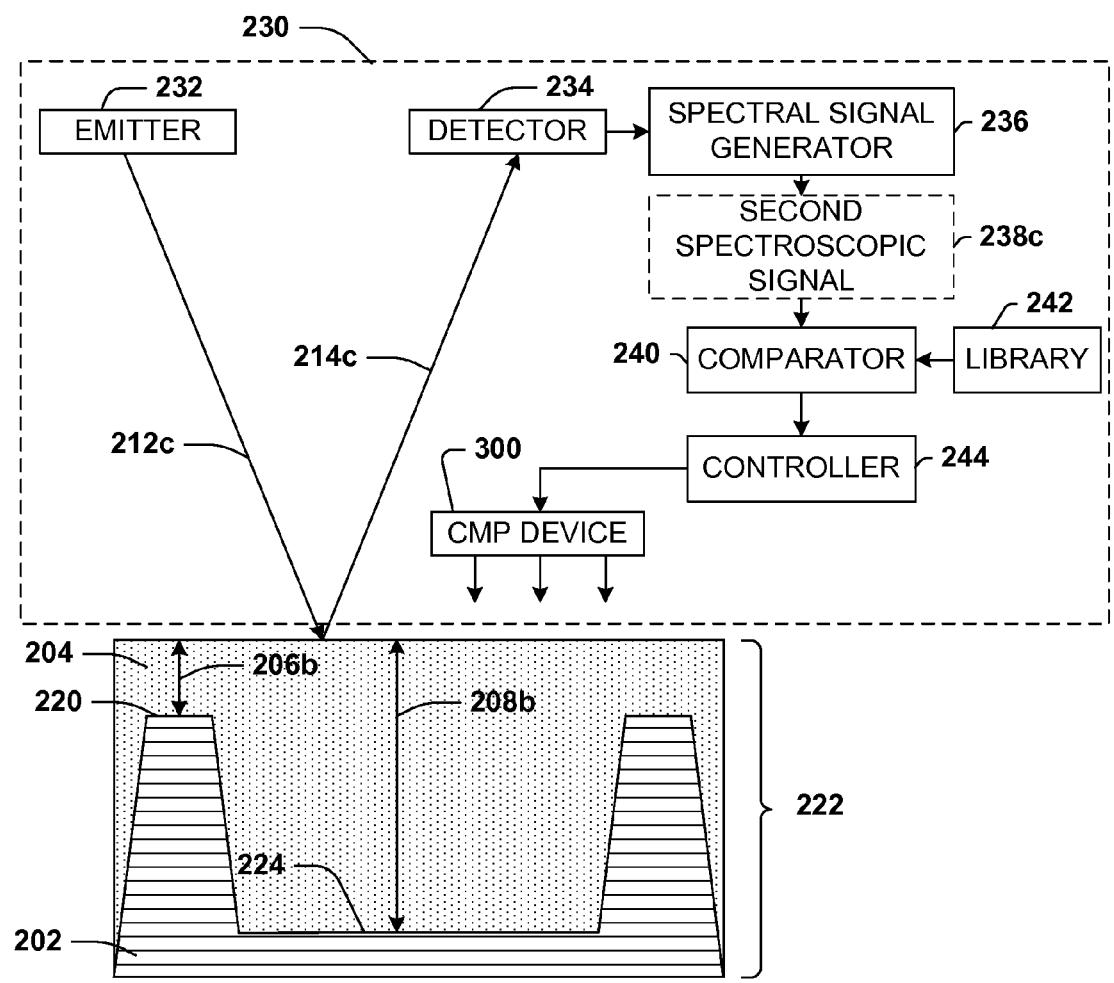
FIG. 4 is an illustration of performing CMP, in accordance with some embodiments.
Figure 5:
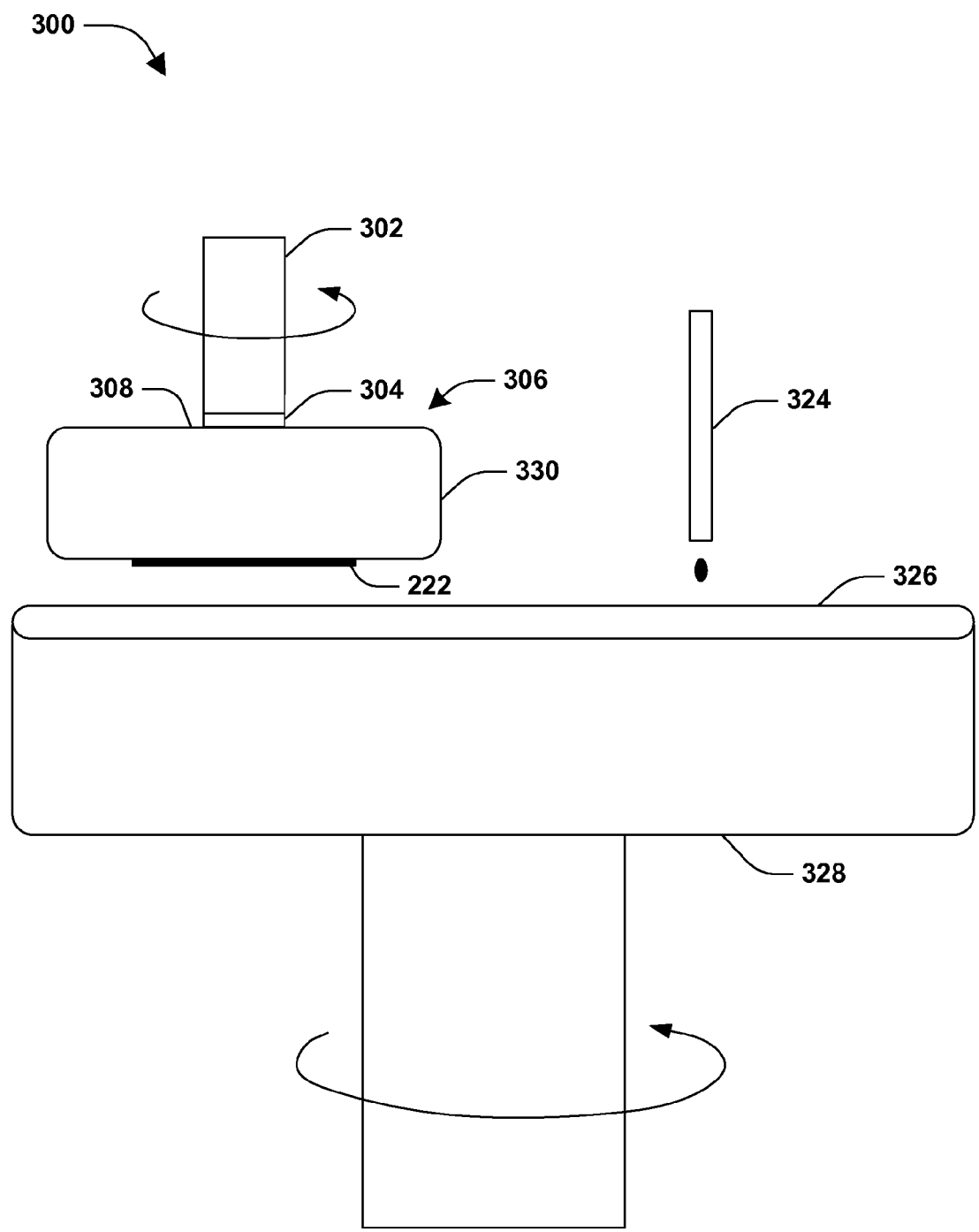
FIG. 5 is an illustration of a device for performing CMP, in accordance with some embodiments.

A method 100 of performing chemical mechanical planarization (CMP) is illustrated in FIG. 1 and performance of CMP at various stages of fabrication is illustrated in FIGS. 2-4. According to some embodiments, such as illustrated in FIG. 5, a chemical CMP device 300 comprises a polishing head 306 configured to planarize or polish a wafer 222 and to smooth the wafer 222 by removing material from the wafer 222 using at least one of chemicals or mechanical forces. In some embodiments, the polishing head 306 applies force to the wafer 222 towards a polishing pad 326 and rotates such that a rotation occurs when the polishing head 306, and thus the wafer 222 coupled to the polishing head 306, completes about a 360° spin. In some embodiments, a thickness of a first material 204, illustrated in FIGS. 2-4, is obtained between consecutive rotations of the polishing head 306 by using a spectroscopic signal, such that once a desired thickness is achieved, an instruction stops CMP processing by the CMP device 300. In some embodiments, obtaining the thickness of the first material 204 between consecutive rotations of the polishing head 306, and thus the wafer 222 attached to the polishing head 306, increases the sensitivity of the CMP, such that the thickness of the first material 204 is reduced with greater accuracy and precision as compared to systems and methods that do not measure the thickness of one or more materials between consecutive rotations of the polishing head 306 and thus the wafer attached thereto.

At 102, an initial thickness 205 and 208a of a first material 204 is obtained using an initial spectroscopic signal, as illustrated in FIG. 2. In some embodiments, the initial thickness 205 and 208a of the first material 204 corresponds to a thickness of the first material 204 at an initial time. In some embodiments, the initial thickness 205 and 206a is measured from a top surface 220 of a fin 202 to a top surface of the first material 204. In some embodiments, the initial thickness 205 and 208a is measured from a bottom surface 224 of the fin 202 to a top surface of the first material 204. In some embodiments, the first material 204 is over the fin 202, and the fin 202 comprises silicon. In some embodiments, the first material 204 comprises one of more layers of materials, such as an oxide layer over a copper layer. In some embodiments, the first material 204 and the fin 202 are formed on or from a wafer 222. In some embodiments, a system 230 for performing CMP, obtains the thickness of the first material 204, and provides instruction to either stop CMP of the first material 204 or further reduce the thickness of the first material 204 by CMP. In some embodiments, the system 230 comprises an emitter 232 component, a detector 234 component, a spectroscopic signal generator 236 component, a comparator 240 component, a spectral library 242 component, a controller 244 component and a CMP device 300, such as the CMP device 300 illustrated in FIG. 5. In some embodiments, the emitter 232 is configured to apply an optical signal to the first material 204. In some embodiments, the emitter 232 emits an initial optical signal 212a, and the initial optical signal 212a is applied to the first material 204. In some embodiments, an initial altered optical signal 214a is detected by the detector 234. In some embodiments, the detector 234 is configured to detect an altered optical signal. In some embodiments, the initial optical signal 212a is altered based upon interacting with the first material 204, such that the initial optical signal 212a is transformed into the initial altered optical signal 214a by interacting with the first material 204. In some embodiments, at least one of the emitter 232 or the detector 234 comprises a window through with an optical signal, such as light, is able to pass. In some embodiments, the window is comprised within the polishing pad 326. In some embodiments, the detector 234 sends the initial altered optical signal 214a to the spectroscopic signal generator 236. In some embodiments, the spectroscopic signal generator 236 component is configured to generate a spectral signal based upon the altered optical signal. In some embodiments, the spectroscopic signal generator 236 generates an initial spectroscopic signal 238a that includes an intensity of the initial spectroscopic signal 238a and the alteration of the initial optical signal 212a based upon interaction with the first material 204 at various wavelengths. In some embodiments, the initial spectroscopic signal 238a comprises a wavelength range between about 400 nm to about 800 nm. In some embodiments, the initial spectroscopic signal 238a comprises a background, including a first noise related spectroscopic signal associated with one or more materials under the first material 204, such as the fin 202, such that the first noise related spectroscopic signal comprises a filter for filtering later generated spectroscopic signals. In some embodiments, the noise related spectroscopic signal removes spectroscopic signals that do not correspond to the first material 204 from later generated spectroscopic signals. In some embodiments, obtaining the initial thickness 205 and 208a or 205 and 206a at the initial time comprises comparing the initial spectroscopic signal 238a to the spectral library 242, or rather to one or more spectral signals stored in the library 242 corresponding to known material thicknesses. In some embodiments, the initial spectroscopic signal 238a is compared to the spectral library 242 by the comparator 240. In some embodiments, the comparator 240 is configured to compare the spectral signal to a spectral library 242 to determine a thickness of the first material 204. In some embodiments, the initial optical signal 212a comprises multiple optical signals, thus the detector 234 detects multiple initial altered optical signals 214a, such that the initial spectroscopic signal 238a is an average of multiple initial altered optical signals 214a. In some embodiments, the spectral library 242 comprises spectral signals that are known to correspond to a thickness of a specific material, such that a first waveform at a first intensity would correspond to a specific thickness of the specific material.

At 104, the system 230 provides an initial instruction, via the controller 244, to perform CMP upon the first material 204, such that after the CMP is performed the first material 204 has a first thickness 208a or 206a, as illustrated in FIG. 3, according to some embodiments. In some embodiments, the controller 244 is configured to compare a thickness of the first material 204 to a desired thickness and to control the CMP device 300 to adjust the thickness of the first material 204. In some embodiments, the CMP at the first time comprises performing CMP for a predetermined reduction time. In some embodiments, the reduction time is based upon a removal rate associated with the CMP. In some embodiments, the removal rate is determined by determining a rate at which the CMP removes a specific material, and then correlating the rate of removal with a desired thickness, such that a longer reduction time removes more material and a shorter reduction time removes less material.

At 106, the first thickness 208a or 206a of the first material 204 is obtained using a first spectroscopic signal 238b, as illustrated in FIG. 3, according to some embodiments. In some embodiments, the first thickness 208a or 206a of the first material 204 corresponds to a thickness of the first material 204 at a first time, the first time after the initial time. In some embodiments, the first thickness 206a is measured from the top surface 220 of the fin 202 to a top surface of the first material 204. In some embodiments, the first thickness 208a is measured from the bottom surface 224 of the fin 202 to a top surface of the first material 204. In some embodiments, the emitter 232 emits a first optical signal 212b, and the first optical signal 212b is applied to the first material 204. In some embodiments, a first altered optical signal 214b is detected by the detector 234. In some embodiments, the first optical signal 212b is altered based upon interacting with the first material 204, such that the first optical signal 212b is transformed into the first altered optical signal 214b by interacting with the first material 204. In some embodiments, the detector 234 sends the first altered optical signal 214b to the spectroscopic signal generator 236, which outputs a first spectroscopic signal 238b based upon the first altered optical signal 214b. In some embodiments, the first noise related spectroscopic signal is subtracted from the first spectroscopic signal, such that the first noise related spectroscopic signal removes parts of the first spectroscopic signal 238b that do not correspond to the first material 204. In some embodiments, the first optical signal 212b comprises multiple optical signals, thus the detector 234 detects multiple first altered optical signals 214b, such that the first spectroscopic signal 238b is an average of multiple first altered optical signals 214b. In some embodiments, obtaining the first thickness 208a or 206a at the first time comprises comparing the first spectroscopic signal 238b to the spectral library 242. In some embodiments, the first spectroscopic signal 238b is compared to the spectral library 242 by the comparator 240 to obtain the first thickness 208a or 206a.

At 108, the system 230 compares the first thickness 208a or 206a to a desired thickness of the first material 204, as illustrated in FIG. 3, according to some embodiments. In some embodiments, if the first thickness 208a or 206a is equal to the desired thickness, no more of the first material 204 will be removed.

At 110, the system 230, via the controller 244, responsive to the first thickness 208a or 206a not corresponding to the desired thickness, provides a first instruction to the CMP device 300 to perform a first reduction, the first reduction occurring during a first rotation of the polishing head 306, such as illustrated in FIG. 5, such that after the first reduction is performed, the first material 204 has a second thickness 208b or 206b, as illustrated in FIG. 4, according to some embodiments. In some embodiments, the first instruction adjusts at least one of a rotation speed of at least one of a polishing pad 326 or a polishing head 306 associated with the CMP, as illustrated in FIG. 5, a pressure associated with at least one of the polishing pad 326 or the a polishing head 306, a composition of a slurry 324 associated with the CMP, or a flow rate associated with the slurry 324 to increase or decrease an amount of the first material 204 removed. In some embodiments, the first instruction is responsive to the difference between the first thickness 208a or 206a and the desired thickness. In some embodiments, if the difference between the first thickness 208a or 206a and the desired thickness is large, such as between about 10 nm to about 20 nm, the first instruction will increase an amount of material removed by the first rotation. In some embodiments, if the difference between the first thickness 208a or 206a and the desired thickness is small, such as between about 0.05 nm to about 10 nm, the first instruction will decrease an amount of material removed by the first rotation. In some embodiments, the pressure associated with the polishing pad 326 or the polishing head 306 is a relative force applied to the wafer 222, so that the polishing pad 326 contacts the wafer to a greater or lesser degree. In some embodiments, increasing the rotation speed of at least one of the polishing pad 326 or the polishing head 306 increases the amount of the first material 204 removed during a rotation and decreasing the rotation speed of at least one of the polishing pad 326 or the polishing head 306 decreases the amount of the first material 204 removed during a rotation. In some embodiments, increasing the pressure of at least one of the polishing pad 326 or the polishing head 306 increases the amount of the first material 204 removed during a rotation and decreasing the pressure of at least one of the polishing pad 326 or the polishing head 306 decreases the amount of the first material 204 removed during a rotation. In some embodiments, increasing a particulate density of the composition of the slurry 324 increases the amount of the first material 204 removed during a rotation and decreasing the particulate density of the composition of the slurry 324 decreases the amount of the first material 204 removed during a rotation. In some embodiments, increasing the flow rate of the slurry 324 increases the amount of the first material 204 removed during a rotation and decreasing the flow rate of the slurry 324 decreases the amount of the first material 204 removed during a rotation.

At 112, the second thickness 208b or 206b of the first material 204 is obtained using a second spectroscopic signal 238c, as illustrated in FIG. 4, according to some embodiments. In some embodiments, the second thickness 208b or 206b of the first material 204 corresponds to a thickness of the first material 204 at a second time, the second time after the first time. In some embodiments, the second thickness 206b is measured from the top surface 220 of the fin 202 to a top surface of the first material 204. In some embodiments, the second thickness 208b is measured from the bottom surface 224 of the fin 202 to the top surface of the first material 204. In some embodiments, the emitter 232 emits a second optical signal 212c, and the second optical signal 212c is applied to the first material 204. In some embodiments, a second altered optical signal 214c is detected by the detector 234. In some embodiments, the second optical signal 212c is altered based upon interacting with the first material 204, such that the second optical signal 212c is transformed into the second altered optical signal 214c by interacting with the first material 204. In some embodiments, the detector 234 sends the second altered optical signal 214c to the spectroscopic signal generator 236, which outputs a second spectroscopic signal 238c based upon the second altered optical signal 214c. In some embodiments, the first noise related spectroscopic signal is subtracted from the second spectroscopic signal; such that the first noise related spectroscopic signal removes parts of the second spectroscopic signal 238c that do not correspond to the first material 204. In some embodiments, the second optical signal 212c comprises multiple optical signals, thus the detector 234 detects multiple second altered optical signals 214c, such that the second spectroscopic signal 238c is an average of multiple second altered optical signals 214c. In some embodiments, obtaining the second thickness 208b or 206b at the second time comprises comparing the second spectroscopic signal 238c to the spectral library 242. In some embodiments, the second spectroscopic signal 238c is compared to the spectral library 242 by the comparator 240 to obtain the second thickness 208b or 206b. In some embodiments, the system 230, via the controller 244, responsive to the second thickness 208b or 206b not corresponding to the desired thickness, provides a second instruction to the CMP device 300 to perform a second reduction, the second reduction occurring during a second rotation of the polishing head 306. In some embodiments, the method 108-112 is repeated as needed, on a rotation, measurement, rotation, measurement, etc. basis, until the thickness of the first material 204 corresponds to the desired thickness.

FIG. 5 illustrates an example of the CMP device 300, comprising the polishing head 306 configured to planarize or polish the wafer 222. In some embodiments, the polishing head 306 comprises a housing 308. In some embodiments, the housing 308 is configured to supply pressure to the polishing head 306 to secure the wafer 222 to a body 330 (e.g., via vacuum) and apply force to the wafer 222 towards a polishing pad 326. In some embodiments, a drive shaft 302 applies rotational force, through a spindle 304, to the housing 308 to rotate the housing 308. In some embodiments, the rotational force is transferred from the housing 308 to the body 330 such that the body 330 rotates the wafer 222 against the polishing pad 326, where the wafer 222 is secured to the body via vacuum in some embodiments. In some embodiments, during polishing, a plate 328 rotates the polishing pad 326 against the wafer 222. In some embodiments, the rotational movement of the polishing pad 326 against the rotating wafer 222 on the polishing head 306 results in a mechanical force that removes material from the wafer 222. In some embodiments, slurry 324 is added to the polishing pad 326 to aid in material removal.

In some embodiments, the method 100, comprising obtaining the thickness of the first material 204 between consecutive rotations of the polishing head 306 and thus the wafer 222 attached thereto, increases the sensitivity of the CMP, such that the thickness of the first material 204 is reduced with greater accuracy and precision, as compared to a method that does not measure material thicknesses between consecutive rotations of the polishing head 306.

According to some embodiments, a method of performing chemical mechanical planarization (CMP) comprises obtaining a thickness of a first material of the semiconductor device at a first time using a first spectroscopic signal, the thickness of the first material corresponding to a first thickness at the first time. In some embodiments, the method of forming a semiconductor device further comprises comparing the first thickness to a desired thickness of the first material and responsive to the first thickness not corresponding to the desired thickness, providing a first instruction to perform a first reduction of the thickness of the first material by performing chemical mechanical planarization (CMP) upon the first material such that the thickness of the first material corresponds to a second thickness at a second time after the first time, the first reduction occurring during a first rotation associated with the CMP. In some embodiments, the method of forming a semiconductor device further comprises obtaining, prior to providing a second instruction to perform a second rotation associated with the CMP, the thickness of the first material using a second spectroscopic signal determine the second thickness.

According to some embodiments, a method of performing chemical mechanical planarization (CMP) comprises obtaining a thickness of a first material of the semiconductor device at an initial time using an initial spectroscopic signal, the thickness of the first material at the initial time corresponding to an initial thickness of the first material and providing an initial instruction to perform an initial reduction of the thickness of the first material by performing chemical mechanical planarization (CMP) upon the first material such that the thickness of the first material corresponds to a first thickness at a first time after the initial time. In some embodiments, the initial reduction occurs during a reduction time associated with the CMP. In some embodiments, the method of forming a semiconductor device further comprises obtaining, prior to performing a first rotation associated with the CMP, the thickness of the first material using a first spectroscopic signal to determine the first thickness and comparing the first thickness to a desired thickness of the first material. In some embodiments, the method of forming a semiconductor device further comprises, responsive to the first thickness not corresponding to the desired thickness, providing a first instruction to perform a first reduction of the thickness of the first material by performing the CMP upon the first material such that the thickness of the first material corresponds to a second thickness at a second time after the first time. In some embodiments, the first reduction occurs during a first rotation associated with the CMP. In some embodiments, the method of forming a semiconductor device further comprises obtaining, prior to providing a second instruction to perform a second rotation associated with the CMP, the thickness of the first material using a second spectroscopic signal to determine the second thickness.

According to some embodiments, a system for performing chemical mechanical planarization (CMP) comprises an emitter component configured to apply an optical signal to a first material of the semiconductor device and a detector component configured to detect an altered optical signal from the first material, where the optical signal is altered based upon interacting with the first material to generate the altered optical signal. In some embodiments, a spectral signal generator component is configured to generate a spectral signal based upon the altered optical signal and a comparator component is configured to compare the spectral signal to a spectral library to determine a thickness of the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

According to some embodiments, "component," "module," "system", "interface", and/or the like refer to a computer-related entity, either hardware, a combination of hardware and software, software, or software in execution. According to some embodiments, a component is a process running on a processor, a processor, an object, an executable, a thread of execution, a program, and/or a computer. According to some embodiments, both an application running on a controller and the controller are a component. According to some embodiments, a component is at least one of localized on one computer or distributed between two or more computers.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of performing chemical mechanical planarization (CMP) comprising:
   rotating at least one of a wafer or a polishing pad underlying the wafer during a chemical mechanical planarization (CMP) process to reduce a thickness of a first material on the wafer;
   halting rotation of the at least one of the wafer or the polishing pad after a first period of time and emitting a first optical signal through the polishing pad while the rotation is halted;
   obtaining a first thickness of the first material using a first spectroscopic signal generated in response to a reflection of the first optical signal, wherein the first thickness corresponds to a distance between a top surface of the first material and a top surface of a fin surrounded by the first material;
   comparing the first thickness to a desired thickness of the first material;

responsive to the first thickness not corresponding to the desired thickness, providing a first instruction to change a parameter of the CMP process to further reduce the thickness of the first material and resuming the rotation of the at least one of the wafer or the polishing pad; and on a rotation-by-rotation basis, until the thickness of the first material on the wafer corresponds to the desired thickness, repeatedly:
resuming the rotation of the at least one of the wafer or the polishing pad;
halting the rotation of the at least one of the wafer or the polishing pad again after a single 360° rotation; and
emitting a second optical signal through the polishing pad while the rotation of the at least one of the wafer or the polishing pad is halted.

2. The method of claim 1, comprising obtaining the first spectroscopic signal comprising:
emitting the first optical signal on the first material; and
detecting a first altered optical signal from the first material, wherein:
the first optical signal is altered based upon the first optical signal interacting with the first material to generate the first altered optical signal, and
the first altered optical signal is the reflection of the first optical signal.

3. The method of claim 1, the obtaining the first thickness of the first material comprising comparing the first spectroscopic signal to a spectral library.

4. The method of claim 1, the first instruction comprising an instruction to adjust:
a rotation speed of at least one of the polishing pad or a wafer carrier associated with the CMP process;
a pressure associated with at least one of the polishing pad or the wafer carrier;
a composition of a slurry associated with the CMP process; and
a flow rate associated with the slurry.

5. The method of claim 1, comprising, on the rotation-by-rotation basis, obtaining a second thickness of the first material by comparing a second spectroscopic signal to a spectral library, wherein the second spectroscopic signal is generated based upon a reflection of the second optical signal.

6. The method of claim 1, comprising, prior to the rotating the at least one of the wafer or the polishing pad, obtaining an initial thickness of the first material using an initial spectroscopic signal.

7. The method of claim 1, the obtaining the first thickness of the first material comprising subtracting a first noise related spectroscopic signal from the first spectroscopic signal.

8. The method of claim 1, the first instruction comprising an instruction to adjust at least one of:
a rotation speed of at least one of the polishing pad or a wafer carrier associated with the CMP process;
a pressure associated with at least one of the polishing pad or the wafer carrier;
a composition of a slurry associated with the CMP process; or
a flow rate associated with the slurry.

9. A method of performing chemical mechanical planarization (CMP) comprising:
obtaining an initial thickness of a first material on a wafer at an initial time using an initial spectroscopic signal;
providing an initial, time-based instruction to perform an initial reduction of a thickness of the first material by performing a chemical mechanical planarization (CMP) process upon the first material based upon the initial thickness obtained using the initial spectroscopic signal;
rotating at least one of the wafer or a polishing pad underlying the wafer based upon the initial, time-based instruction to reduce the thickness of the first material on the wafer;
halting rotation of the at least one of the wafer or the polishing pad and emitting a first optical signal through the polishing pad while the rotation of the wafer is halted, the initial, time-based instruction comprising a predetermined amount of time that the at least one of the wafer or the polishing pad is to rotate before the halting, the predetermined amount of time based upon a removal rate associated with the CMP process, and the rotation of the at least one of the wafer or the polishing pad halted when the predetermined amount of time lapses;
comparing a first thickness, determined using a reflection of the first optical signal and measured from a top surface of the first material to at least one of a top surface of a fin surrounded by the first material or a bottom surface of the fin, to a desired thickness of the first material;
responsive to the first thickness not corresponding to the desired thickness, providing a first instruction to change a parameter of the CMP process to further reduce the thickness of the first material; and
on a rotation-by-rotation basis, until the thickness of the first material on the wafer corresponds to the desired thickness, repeatedly:
resuming the rotation of the at least one of the wafer or the polishing pad;
halting the rotation of the at least one of the wafer or the polishing pad again after a single 360° rotation; and
emitting a second optical signal through the polishing pad while the rotation of the at least one of the wafer or the polishing pad is halted.

10. The method of claim 9, comprising, on the rotation-by-rotation basis, obtaining a second thickness of the first material by comparing a second spectroscopic signal to a spectral library, wherein the second spectroscopic signal is generated based upon a reflection of the second optical signal.

11. The method of claim 9, the obtaining the initial thickness comprising generating a first noise related spectroscopic signal.

12. The method of claim 11, the obtaining the initial thickness comprising subtracting the first noise related spectroscopic signal from the initial spectroscopic signal.

13. The method of claim 9, comprising obtaining the initial spectroscopic signal comprising:
emitting an initial optical signal on the first material; and
detecting an initial altered optical signal from the first material, wherein:
the initial optical signal is altered based upon the initial optical signal interacting with the first material to generate the initial altered optical signal, and
the initial altered optical signal is a reflection of the initial optical signal.

14. The method of claim 9, the obtaining the initial thickness of the first material on the wafer comprising comparing the initial spectroscopic signal to a spectral library.

15. The method of claim 9, comprising obtaining a first spectroscopic signal comprising:

emitting the first optical signal on the first material; and
detecting a first altered optical signal from the first material, wherein:
  the first optical signal is altered based upon the first optical signal interacting with the first material to generate the first altered optical signal, and
  the first altered optical signal is the reflection of the first optical signal.

16. The method of claim 15, comprising:
obtaining the first thickness of the first material using the first spectroscopic signal by comparing the first spectroscopic signal to a spectral library.

17. The method of claim 9, comprising on the rotation-by-rotation basis:
  detecting a second altered optical signal from the first material, wherein:
    the second optical signal is altered based upon the second optical signal interacting with the first material to generate the second altered optical signal, and
    the second altered optical signal is a reflection of the second optical signal.

18. The method of claim 17, comprising obtaining a second thickness of the first material using a second spectroscopic signal by comparing the second spectroscopic signal, generated using the second altered optical signal, to a spectral library.

19. A method of performing chemical mechanical planarization (CMP) comprising:
  for a first thickness measurement of a first material on a wafer:
    emitting multiple optical signals through a polishing pad underlying a wafer between rotations of the wafer;
    detecting multiple altered optical signals in response to the multiple optical signals reflecting from a first material on the wafer; and
    averaging the multiple altered optical signals to generate a spectroscopic signal;
  adjusting a chemical mechanical planarization (CMP) process while rotation of the wafer is halted based upon the first thickness measurement determined from the spectroscopic signal when the first thickness measurement does not correspond to a desired thickness measurement, wherein the first thickness measurement corresponds to a distance between a top surface of the first material and at least one of a top surface of a fin surrounded by the first material or a bottom surface of the fin; and
  on a rotation-by-rotation basis, until a measured thickness of the first material on the wafer corresponds to the desired thickness measurement, repeatedly:
    resuming the rotation of the at least one of the wafer or the polishing pad;
    halting the rotation of the at least one of the wafer or the polishing pad again after a single 360° rotation; and
    emitting a second optical signal through the polishing pad while the rotation of the at least one of the wafer or the polishing pad is halted.

20. The method of claim 19, comprising on the rotation-by-rotation basis, obtaining a second thickness measurement of the first material by comparing a second spectroscopic signal to a spectral library, where the second spectroscopic signal is generated based upon a reflection of the second optical signal.

* * * * *